US012727150B2

(12) United States Patent
Ahn

(10) Patent No.: US 12,727,150 B2
(45) Date of Patent: Sep. 1, 2026

(54) SEMICONDUCTOR DEVICE

(71) Applicant: Samsung Electronics Co., Ltd., Suwon-si (KR)

(72) Inventor: Junhyeok Ahn, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 553 days.

(21) Appl. No.: 18/319,601

(22) Filed: May 18, 2023

(65) Prior Publication Data

US 2024/0023318 A1 Jan. 18, 2024

(30) Foreign Application Priority Data

Jul. 12, 2022 (KR) ........................ 10-2022-0085549

(51) Int. Cl.
*H10B 12/00* (2023.01)

(52) U.S. Cl.
CPC ........... *H10B 12/482* (2023.02); *H10B 12/03* (2023.02); *H10B 12/485* (2023.02); *H10B 12/488* (2023.02)

(58) Field of Classification Search
CPC .... H10B 12/482; H10B 12/03; H10B 12/485; H10B 12/488; H10B 12/315; H10B 12/0335; H10B 12/50; H10B 12/05; H10B 12/34; G11C 8/14; G11C 11/4097
See application file for complete search history.

(56) References Cited

U.S. PATENT DOCUMENTS 8,334,556 B2 12/2012 Lee et al.
8,357,600 B2 1/2013 Shin et al.
8,598,012 B2 12/2013 Shin et al.
9,831,172 B2 11/2017 Kim et al.
2006/0170107 A1* 8/2006 Park ...................... H10W 20/40 257/773
2011/0165747 A1* 7/2011 Kim ..................... H10B 12/488 438/270
2013/0256769 A1 10/2013 Jeong et al.
2015/0333069 A1* 11/2015 Kim ....................... H10B 12/34 257/334
2022/0045182 A1 2/2022 Kim et al.
2022/0384449 A1* 12/2022 Kim ....................... H10B 12/34

FOREIGN PATENT DOCUMENTS

| | | | |
|---|---|---|---|
| EP | 4095909 | A1 | 11/2022 |
| KR | 20110108549 | A | 10/2011 |
| KR | 20120003742 | A | 1/2012 |
| KR | 20140091842 | A | 7/2014 |

OTHER PUBLICATIONS

Extended European Search Report corresponding to European Patent Application No. 23182390.7 (8 pages) (dated Dec. 1, 2023).

* cited by examiner

*Primary Examiner* — Yasser A Abdelaziez
(74) *Attorney, Agent, or Firm* — Wolf, Greenfield & Sacks, P.C.

(57) ABSTRACT

A semiconductor device includes an active region between portions of a device isolation layer on a substrate, a self-aligned pad layer on a first region of the active region, a bit line that is electrically connected to a second region of the active region, and a contact structure on a side surface of the bit line and electrically connected to the self-aligned pad layer. The self-aligned pad layer includes a pad protrusion that extends along an upper portion of a side surface of the first region of the active region, and a side of the self-aligned pad layer is in contact with the device isolation layer.

20 Claims, 25 Drawing Sheets

SEMICONDUCTOR DEVICE

CROSS-REFERENCE TO RELATED APPLICATION(S)

This application claims the benefit under 35 U.S.C. § 119 to Korean Patent Application No. 10-2022-0085549 filed on Jul. 12, 2022 in the Korean Intellectual Property Office, the disclosure of which is incorporated herein by reference in its entirety.

BACKGROUND

The present inventive concept relates to a semiconductor device. According to the development of the electronics industry and the needs of users, electronic devices are becoming smaller and higher in terms of performance. Accordingly, semiconductor devices used in electronic devices need to be highly integrated and to have high-performance. In order to manufacture a highly scaled semiconductor device, a technique for stably forming pad layers on an active region is desired.

SUMMARY

Example embodiments provide a semiconductor device having improved electrical characteristics and reliability.

According to example embodiments, a semiconductor device includes an active region between portions of a device isolation layer on a substrate, a self-aligned pad layer on a first region of the active region, a bit line that is electrically connected to a second region of the active region, and a contact structure on a side surface of the bit line and electrically connected to the self-aligned pad layer. The self-aligned pad layer includes a pad protrusion that extends along an upper portion of a side surface of the first region of the active region e, and a side of the self-aligned pad layer is in contact with the device isolation layer.

According to example embodiments, a semiconductor device includes a word line extending in a first direction, a first active region and a second active region adjacent to each other in the first direction, a device isolation layer between the first active region and the second active region, a first pad layer on the first active region, a second pad layer on the second active region, and a bit line on the first active region and the second active region and extending in a second direction, that intersects the first direction. The word line intersects at least one of the first active region and the second active region, and in the first direction, a first distance between a side surface of the first pad layer and a side surface of the second pad layer is less than a second distance that is a distance between an upper side surface of the first active region and an upper side surface of the second active region that are closest to one another.

According to example embodiments, a semiconductor device includes active regions between portions of a device isolation layer on a substrate, self-aligned pad layers on the active regions, and bit lines that are electrically connected to the active regions, respectively. The device isolation layer includes a first portion between adjacent ones of the active regions and a second portion between adjacent ones of the self-aligned pad layers, and the device isolation layer includes a bent portion in a region in which the first portion and the second portion are connected to each other.

According to example embodiments, a method of manufacturing a semiconductor device includes forming trenches, active regions, and mask patterns by patterning a substrate, forming a passivation layer on the active regions and the mask patterns, forming a sacrificial layer in the trenches and overlapping the passivation layer, removing a portion of the sacrificial layer to expose the passivation layer, removing a portion of the passivation layer to expose the mask patterns, forming openings by removing the mask patterns and partially removing the passivation layer, forming a preliminary pad layer in the openings and overlapping the sacrificial layer, forming self-aligned pad layers by node isolation of the preliminary pad layer, removing the sacrificial layer and the passivation layer, forming a device isolation layer in spaces between adjacent ones of the self-aligned pad layers and in the trenches, forming word line structures embedded in the substrate, intersecting the active regions, and penetrating through the self-aligned pad layers, and forming bit line structures that intersect the word line structures.

According to example embodiments, a method of manufacturing a semiconductor device includes patterning a substrate to form active regions, forming self-aligned pads on the active regions, forming a device isolation layer in spaces between adjacent ones of the active regions and in between the self-aligned pads, forming word line structures embedded in the substrate, intersecting the active regions, and penetrating through the self-aligned pads, forming bit line contact holes between the word line structures, exposing a portion of the active regions and penetrating through the self-aligned pads, and forming bit line structures on the bit line contact holes.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments will be described with reference to the accompanying drawings.

Figure 1:
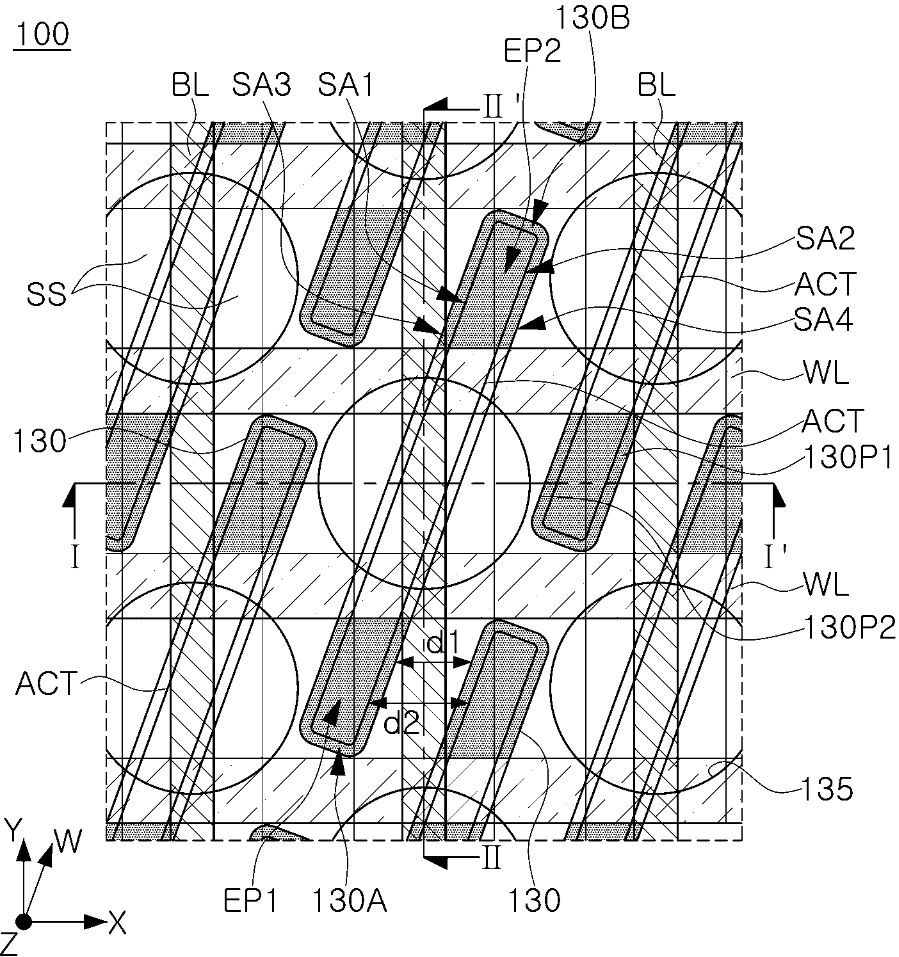
FIG. 1 is a schematic plan view of a semiconductor device according to example embodiments.

FIG. 1 is a schematic plan view of a semiconductor device according to example embodiments.

Figure 2:
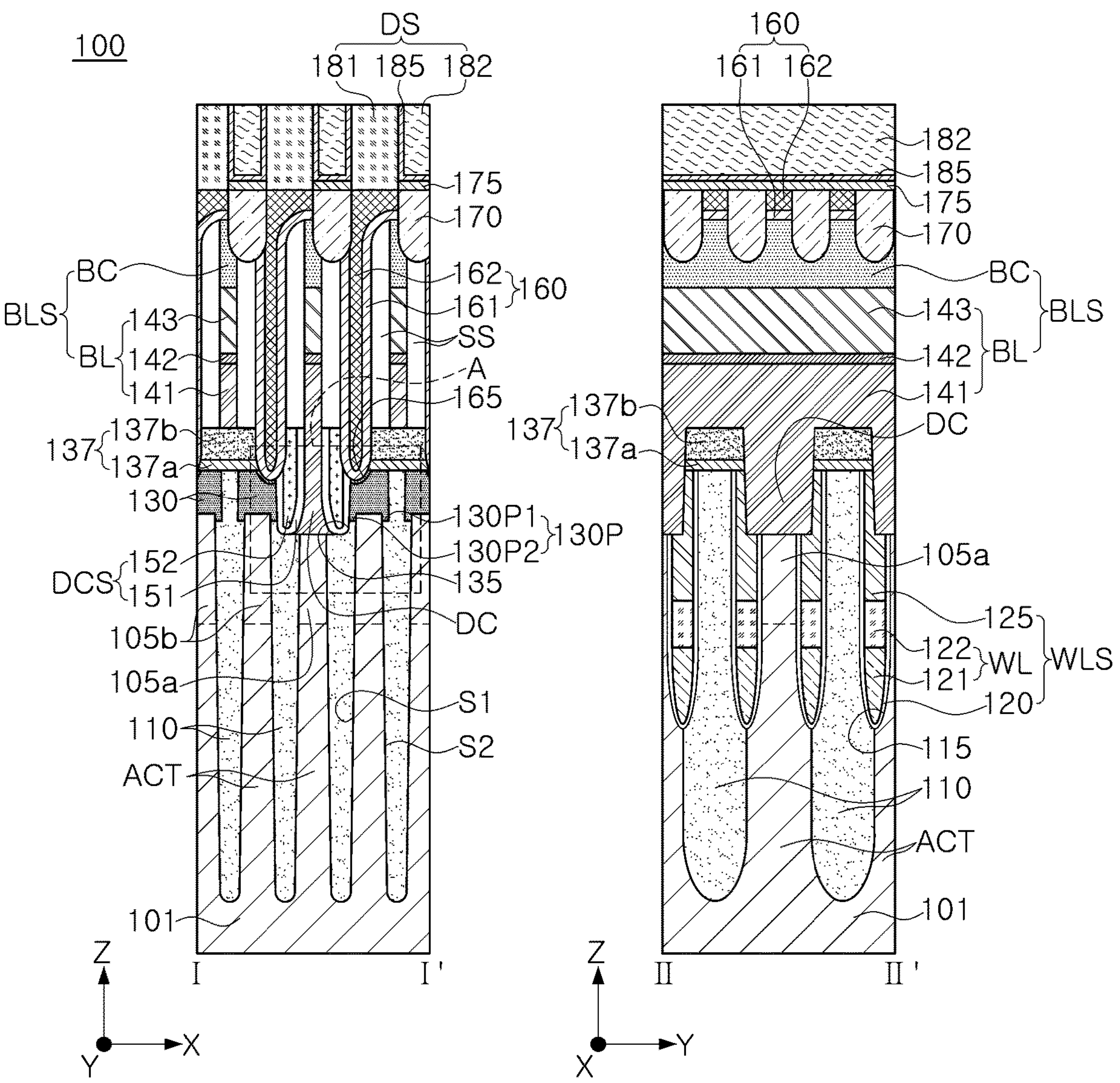
FIG. 2 is a schematic cross-sectional view of a semiconductor device according to example embodiments.
Figure 3A:
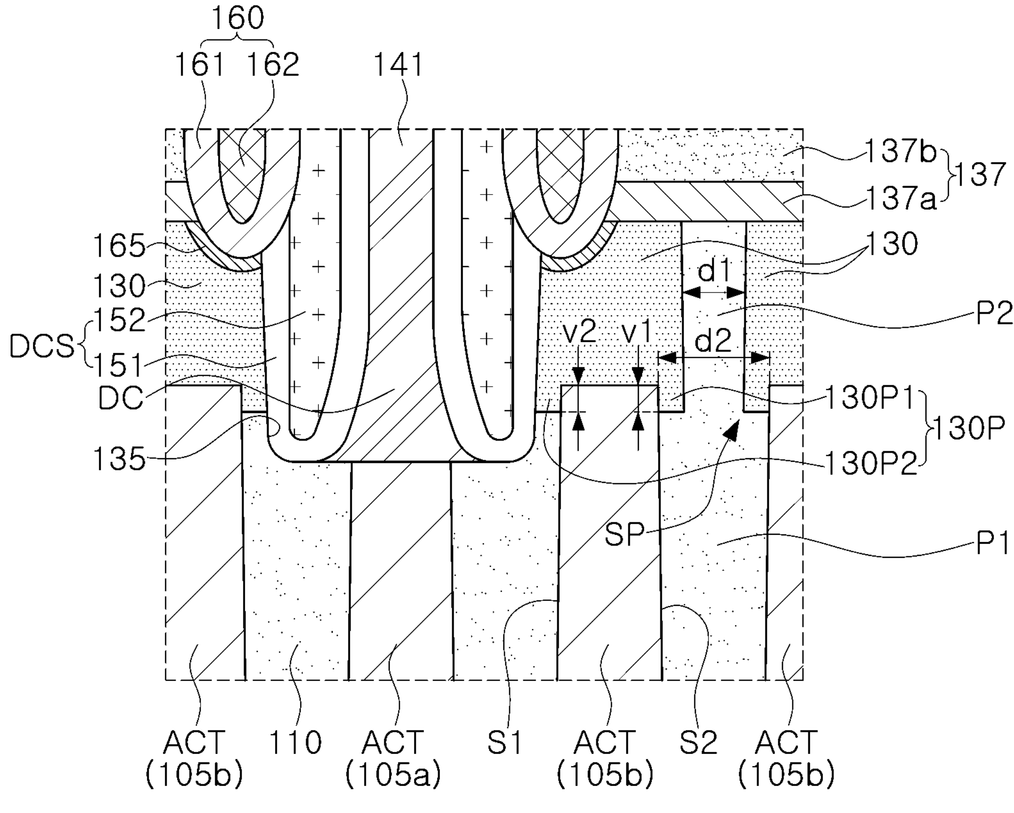
FIGS. 3A and 3B are partially enlarged cross-sectional views of semiconductor devices according to example embodiments.

FIG. 2 is a schematic cross-sectional view of a semiconductor device according to example embodiments. FIG. 2 illustrates cross-sections of the semiconductor device of FIG. 1 taken along lines I-I' and FIG. 3A is a partially enlarged cross-sectional view of a semiconductor device according to example embodiments. FIG. 3A is an enlarged view of area 'A' in FIG. 2

Referring to FIGS. 1 to 3A, a semiconductor device 100 may include a substrate 101, active regions ACT defined by a device isolation layer 110 in the substrate 101, self-aligned pad layers 130 on the active regions ACT, a word line structure WLS including a word line WL, a buffer insulating layer 137 on the self-aligned pad layers 130, a bit line structure BLS including a bit line BL, a spacer structure SS on a side of the bit line structure BLS, a contact structure 160 on a side surface of a spacer structure SS, an isolation insulating pattern 170 separating the contact structure 160, and an information storage structure DS on the contact structure 160. As used herein, "self-aligned" may indicate that a component is aligned on a position corresponding to or overlapping with that of another component.

The semiconductor device 100 may include, for example, a cell array of a dynamic random access memory (DRAM). For example, the word line WL and the active region ACT make up a memory cell transistor, the bit line BL may be electrically connected to a first impurity region 105*a* of the active region ACT, and a second impurity region 105*b* of the active region ACT may be electrically connected to the information storage structure DS through the contact structure 160.

The substrate 101 may include a semiconductor material, for example, a group IV semiconductor, a group III-V compound semiconductor, or a group II-VI compound semiconductor. For example, the group IV semiconductor may include silicon, germanium, or silicon-germanium. The substrate 101 may further include impurities. The substrate 101 may be a silicon substrate, a silicon on insulator (SOI) substrate, a germanium substrate, a germanium on insulator (GOI) substrate, a silicon-germanium substrate, or a substrate comprising an epitaxial layer.

The active regions ACT may be restricted or defined in the substrate 101 by the device isolation layer 110. The active region ACT may have a bar shape having a major axis and a minor axis, and the substrate 101 may be disposed in an island shape extending in one direction, for example, the W direction. The W direction may be inclined with respect to the extension directions of the word lines WL and the bit lines BL. The active regions ACT may be arranged parallel to each other, and an end of one active region ACT may be arranged adjacent to a center of another active region ACT adjacent thereto.

The active region ACT may include single crystal silicon. The active region ACT may have first and second impurity regions 105*a* and 105*b* having a predetermined depth from the upper surface of the substrate 101. The first and second impurity regions 105*a* and 105*b* may be spaced apart from each other. The first impurity region 105*a* may be electrically connected to the bit line BL, and the second impurity region 105*b* may be connected to the self-aligned pad layer 130. The first and second impurity regions 105*a* and 105*b* may serve as source/drain regions of the transistor formed by the word line WL. For example, a drain region may be formed between two word lines WL traversing one active region ACT, and source regions may be respectively formed outside the two word lines WL. The source region and the drain region are formed as the first and second impurity regions 105*a* and 105*b* by doping or ion implantation with substantially the same impurities, and may be referred to interchangeably depending on the circuit configuration of the finally formed transistor. The impurities may include dopants having a conductivity type opposite to a conductivity type of the substrate 101. In example embodiments, depths of the first and second impurity regions 105*a* and 105*b* in the source region and the drain region may be different from each other.

The device isolation layer 110 may be formed by a shallow trench isolation (STI) process. The device isolation layer 110 may surround side surfaces of the active regions ACT and electrically isolate the active regions from each other. The device isolation layer 110 may be formed of an insulating material. The device isolation layer 110 may include a plurality of regions having different lower depths according to the width of the trench in which the substrate 101 is etched. The device isolation layer 110 may include an insulating material, for example, at least one of silicon oxide, silicon nitride, silicon, and/or oxynitride.

The device isolation layer 110 may include a first portion P1 between adjacent active regions ACT and a second portion P2 between adjacent self-aligned pad layers 130. The second portion P2 may be disposed on the first portion P1, and may form a continuous structure with the first portion P1. The upper surface of the device isolation layer 110 may be positioned at a higher level than a level of the lower surface of the self-aligned pad layer 130. The second portion P2 may be located at a level higher than a level of the upper surface of the active region ACT. As illustrated in FIG. 3A, the device isolation layer 110 may include a bent portion SP in a region in which the first portion P1 and the second portion P2 are connected to each other. The bent portion SP may be angled and extend below a top surface of the second impurity region 105*b*. A width of a lower portion of the second portion P2 may be less than a width of an upper portion of the first portion P1. The width of the first part P1 may decrease from the top to the bottom, and the width of the second part P2 may decrease from the top to the bottom.

Word line structures WLS may be disposed in gate trenches 115 extending in the substrate 101. Each of the word line structures WLS may include a gate dielectric layer 120, a word line WL, and a gate capping layer 125. In this specification, the 'gate (120, WL)' may be referred to as a structure including the gate dielectric layer 120 and the word line WL, the word line WL may be referred to as a 'gate electrode,' and the word line structure WLS may be referred to as a 'gate structure.'

The word line WL may be disposed to extend in the X-direction while traversing the active region ACT. For example, a pair of adjacent word lines WL may be disposed to traverse one active region ACT. The word line WL may be buried in the substrate 101 to form a gate of a buried channel array transistor (BCAT), but the present inventive concept is not limited thereto. In example embodiments, the word lines WL may have a shape disposed on the substrate 101. The word line WL may be disposed below the gate trench 115 to have a predetermined thickness. The upper surface of the word line WL may be positioned on a level lower than a level of the upper surface of the substrate 101. In this specification, the high and low of the term "level" may be defined based on a substantially flat upper surface of the substrate 101.

The word line WL may include a conductive material, for example, at least one of polycrystalline silicon (Si), titanium (Ti), titanium nitride (TiN), tantalum (Ta), tantalum nitride (TaN), tungsten (W), tungsten nitride (WN), and/or aluminum (Al). For example, the word line WL may include a lower pattern 121 and an upper pattern 122 formed of different materials.

For example, the lower pattern 121 may include at least one of tungsten (W), titanium (Ti), tantalum (Ta), tungsten nitride (WN), titanium nitride (TiN), and/or tantalum nitride (TaN). For example, the upper pattern 122 may be a semiconductor pattern including polysilicon doped with P-type or N-type impurities, and the lower pattern 121 may be a metal pattern including at least one of a metal and a metal nitride. The thickness of the lower pattern 121 may be greater than the thickness of the upper pattern 122. Each of the lower pattern 121 and the upper pattern 122 may extend in the X-direction.

The gate dielectric layer 120 may be disposed on the bottom and inner side surfaces of the gate trench 115. The gate dielectric layer 120 may conformally cover or overlap an inner wall of the gate trench 115. The gate dielectric layer 120 may include at least one of silicon oxide, silicon nitride, and/or silicon oxynitride. The gate dielectric layer 120 may be, for example, a silicon oxide film or an insulating film having a high dielectric constant. In example embodiments, the gate dielectric layer 120 may be a layer formed by oxidizing the active region ACT or a layer formed by deposition.

The gate capping layer 125 may be disposed on the word line WL to fill the gate trench 115. The upper surface of the gate capping layer 125 may be positioned at substantially the same level as the upper surface of the self-aligned pad layer 130. An upper surface of the gate capping layer 125 may be positioned at a higher level than a level of a lower surface of the self-aligned pad layer 130. The gate capping layer 125 may be formed of an insulating material, for example, silicon nitride.

The self-aligned pad layers 130 may be electrically connected to the second impurity regions 105*b* of the active regions ACT. The self-aligned pad layers 130 may be disposed between the second impurity region 105*b* and the contact structure 160. The self-aligned pad layers 130 may be formed of a polysilicon layer including impurities, for example, a polysilicon layer having an N-type conductivity.

The self-aligned pad layers 130 may be formed in an aligned state on the active regions ACT. For example, the self-aligned pad layers 130 may have a shape corresponding to a portion of the active regions ACT in a plan view. For example, the self-aligned pad layers 130 may extend in the W direction in which the active regions ACT extend. However, the self-aligned pad layers 130 may be separated from each other in the W direction by the word line structures WLS and a bit line contact hole 135.

For example, as illustrated in the plan view of FIG. 1, the active region ACT has a first surface SA1 and a second surface SA2 parallel to the major axis in the W direction, and the self-aligned pad layer 130 may have a third surface SA3 parallel to the first surface SA1 and a fourth surface SA4 parallel to the second surface SA2.

The self-aligned pad layers 130 may be separated into two in the W direction on one active region ACT. For example, as shown in FIG. 1, the self-aligned pad layer 130 may include a first pattern portion 130A on a first end EP1 of the active region ACT, and a second pattern portion 130B on a second end EP2 opposite to the first end EP1 of the active region ACT. In a plan view, the first pattern portion 130A may have a shape corresponding to a portion of the first end EP1, and in a plan view, the second pattern portion 130B may have a shape corresponding to a portion of the second end EP2. For example, in plan view, the first pattern portion 130A may have a rounded end shape corresponding to the shape of the rounded first end EP1, and the second pattern portion 130B may have a rounded end shape corresponding to the shape of the rounded second end EP2.

The self-aligned pad layer 130 may include a pad protrusion 130P extending downwardly along the upper side surface of the active region ACT and surrounding at least a portion of the upper side surface of the active region ACT as illustrated in FIG. 3A. The pad protrusion 130P may contact the device isolation layer 110. The pad protrusion 130P of the self-aligned pad layer 130 may be positioned at a level lower than a level of the upper surface of the device isolation layer 110.

For example, the pad protrusion 130P may include a first pad protrusion 130P1 in contact with an upper region of a first side surface S1 of the active region ACT, and a second pad protrusion 130P2 in contact with an upper region of a second side surface S2 opposite to the first side surface S1 of the active region ACT. A depth v1 of the first pad protrusion 130P1 may be substantially the same as a depth v2 of the second pad protrusion 130P2. A thickness of the first pad protrusion 130P1 in a horizontal direction from the first side surface S1 of the active region ACT may be substantially equal to a thickness of the second pad protrusion 130P2 in the horizontal direction from the second side surface S2 of the active region ACT. The pad protrusions 130P1 and 130P2 may cover or overlap the upper side surface of the active region ACT with a substantially uniform thickness in a plan view.

The self-aligned pad layer 130 may become narrower from the bottom to the top. The sides of the self-aligned pad layer 130 may be inclined, and the inclination angle of the side surface of the self-aligned pad layer 130 may be the same as or similar to the inclination angle of the side surface of the active region ACT. A side of the self-aligned pad layer 130 may be in contact with the device isolation layer 110.

The active region ACT may include a first active region ACT and a second active region ACT adjacent to each other in the X-direction, and the self-aligned pad layer 130 may include a first self-aligned pad layer 130 on the first active region ACT and a second self-aligned pad layer 130 on the second active region ACT. In the X-direction, a first distance d1 between the side surface of the first self-aligned pad layer 130 and the side surface of the second self-aligned pad layer 130 may be less than a second distance d2, which is a minimum distance between the upper surfaces of the first active region ACT and the upper surface of the second active region ACT.

According to example embodiments, the self-aligned pad layers 130 are formed to be self-aligned on the active regions ACT to correspond to the respective active regions ACT, and therefore, there may not be a need to form separate separation layers that separate the pad layer in the X-direction or the Y-direction. A bit line contact hole 135 provided for electrical connection between the active region ACT and the bit line BL is needed to be formed to a depth lower than the lower end of the separate separation layers. According to example embodiments of the present inventive concept, since the self-aligned pad layers 130 may be provided, separate separation layers are not required, and therefore, it is not necessary to dig the bit line contact hole 135 relatively deeply. Therefore, the difficulty of the etching process of the bit line contact hole 135 may be reduced. Accordingly, the manufacturing process of the semiconductor device may be simplified and manufacturing costs may be reduced.

On the other hand, the device isolation layer 110 formed of silicon oxide may be disposed between the self-aligned pad layers 130. Since the electrical separation of the self-aligned pad layers 130 is possible with silicon oxide having a lower dielectric constant than a dielectric constant of silicon nitride, disturbance and parasitic capacitance between the active regions ACT or between the self-aligned pad layers 130 may be reduced further than when electrically isolated with separate isolation layers of silicon nitride, and leakage current may be prevented. Accordingly, the electrical characteristics of the semiconductor device may be improved.

The buffer insulating layer 137 may include at least one material layer. For example, the buffer insulating layer 137 may include a first buffer insulating layer 137*a* and a second buffer insulating layer 137*b* on the first buffer insulating layer 137*a*. The first buffer insulating layer 137*a* and the second buffer insulating layer 137*b* may be formed of different insulating materials. For example, the first buffer insulating layer 137*a* may be formed of silicon oxide, and the second buffer insulating layer 137*b* may be formed of silicon nitride. The number and/or types of layers included in the buffer insulating layer 137 may be variously changed according to example embodiments.

The bit line structure BLS may extend in one direction, for example, a Y-direction, perpendicular to the word line WL. The bit line structure BLS may include the bit line BL and a bit line capping pattern BC on the bit line BL.

The bit line BL may include a first conductive pattern 141, a second conductive pattern 142, and a third conductive pattern 143 that are sequentially stacked. The bit line capping pattern BC may be disposed on the third conductive pattern 143. The buffer insulating layer 137 may be disposed between the first conductive pattern 141 and the substrate 101, and a portion of the first conductive pattern 141 (hereinafter, the bit line contact pattern DC) may be in contact with the first impurity region 105*a* of the active region ACT. The bit line BL may be electrically connected to the first impurity region 105*a* through the bit line contact pattern DC. The lower surface of the bit line contact pattern DC may be positioned at a level lower than a level of the upper surface of the substrate 101, and may be positioned at a higher level than a level of the upper surface of the word line WL. The bit line contact pattern DC may be formed in the substrate 101 to be locally disposed in the bit line contact hole 135 exposing the first impurity region 105*a*.

The first conductive pattern 141 may include a semiconductor material such as polycrystalline silicon. The first conductive pattern 141 may directly contact the first impurity region 105*a*. The second conductive pattern 142 may include a metal-semiconductor compound. The metal-semiconductor compound may be, for example, a silicided layer of a portion of the first conductive pattern 141. For example, the metal-semiconductor compound may include cobalt silicide (CoSi), titanium silicide (TiSi), nickel silicide (NiSi), tungsten silicide (WSi), and/or other metal silicides. The third conductive pattern 143 may include a metal material such as titanium (Ti), tantalum (Ta), tungsten (W), and/or aluminum (Al). The number of conductive patterns included in the bit line BL, the type of material, and/or the stacking order may be variously changed according to example embodiments.

The bit line capping pattern BC may be disposed on the third conductive pattern 143. The bit line capping pattern BC may include an insulating material, for example, a silicon nitride layer. The bit line capping pattern BC may include a plurality of layers including the same or different materials.

The spacer structures SS may be disposed on both side surfaces of each of the bit line structures BLS to extend in one direction, for example, the Y-direction. The spacer structures SS may be disposed between the bit line structure BLS and the contact structure 160. The spacer structures SS may be disposed to extend along side surfaces of the bit line BL and side surfaces of the bit line capping pattern BC. Each of the spacer structures SS may include a plurality of spacers. The number and/or arrangement of the plurality of spacers may be variously changed according to example embodiments.

The spacer structures SS may further include a bit line contact spacer DCS. The bit line contact spacer DCS may fill the remainder of the bit line contact hole 135 in which the bit line contact pattern DC is formed. The bit line contact spacer DCS may include a plurality of spacer layers 151 and 152. The first spacer layer 151 may extend along the side surface of the bit line contact hole 135 and surround the bit line contact pattern DC, and the second spacer layer 152 may be disposed to fill the inner space of the first spacer layer 151. However, the structure of the bit line contact spacer DCS is not limited thereto, and may be variously changed according to example embodiments.

Respective layers included in the spacer structure SS may include an insulating material, for example, at least one of silicon oxide, silicon nitride, silicon oxynitride, and/or silicon oxycarbide.

The contact structure 160 may be connected to a portion of the self-aligned pad layer 130 and may be electrically connected to one region of the active region ACT, for example, the second impurity region 105*b*. The contact structure 160 may be electrically connected to the second impurity region 105*b* through a metal-semiconductor compound layer 165 and the self-aligned pad layer 130 disposed therebelow. The contact structure 160 may be disposed between adjacent bit line structures BLS, and may be disposed on a side surface of the spacer structure SS. The contact structure 160 may be disposed between adjacent spacer structures SS, for example. The lower surface of the contact structure 160 may be located at a level lower than a level of the upper surface of the substrate 101, and may be located on a higher level than a level of the lower surface of the bit line contact pattern DC. The contact structure 160 may be electrically insulated from the bit line BL by the spacer structure SS.

The contact structure 160 may include a barrier layer 161 and a contact conductive layer 162. The barrier layer 161 may surround a lower surface and side surfaces of the contact conductive layer 162. The barrier layer 161 may include, for example, a conductive metal nitride such as titanium nitride (TiN), tantalum nitride (TaN), and/or tungsten nitride (WN). The contact conductive layer 162 may include a metallic material, for example, at least one of titanium (Ti), tantalum (Ta), tungsten (W), aluminum (Al), cobalt (Co), and/or ruthenium (Ru). In another example, a contact structure of a semiconductor material such as doped polysilicon may be further disposed between the contact structure 160 and the self-aligned pad layer 130.

The metal-semiconductor compound layer 165 may be, for example, a layer in which a portion of the self-aligned pad layer 130 is silicided. The metal-semiconductor compound layer 165 may be disposed between the self-aligned pad layer 130 and the contact structure 160, and may surround at least a portion of a lower portion of the contact structure 160. The metal-semiconductor compound layer 165 may include, for example, metal silicide, metal germanide, and/or metal silicide-germanide. The metal-semiconductor compound layer 165 may include, for example, cobalt silicide (CoSi), titanium silicide (TiSi), nickel silicide (NiSi), tungsten silicide (WSi), and/or other metal silicide. In some embodiments, the metal-semiconductor compound layer 165 may be omitted.

The isolation insulating pattern 170 may pass through the contact structure 160 and may contact the spacer structure SS and the bit line capping pattern BC. The isolation insulating pattern 170 may include an insulating material, for example, silicon nitride or silicon oxynitride. The isolation insulating pattern 170 may have a shape in which the width in the horizontal direction becomes narrower as it approaches the substrate 101, and may have a side inclined with respect to the upper surface of the substrate 101.

The information storage structure DS may be disposed on the contact structure 160 and the isolation insulating pattern 170. The information storage structure DS may be electrically connected to the second impurity region 105*b* of the active region ACT through the contact structure 160. The information storage structure DS may include a first electrode 181, a second electrode 182, and a dielectric layer 185. The first electrode 181 may pass through an etch stop layer 175 to be connected to the contact structure 160. The first electrode 181 may have a pillar shape, but may have a cylinder shape in another example. The structure of the information storage structure DS is not limited to the illustration, and may be variously changed according to example embodiments.

Each of the first electrode 181 and the second electrode 182 may include at least one of a doped semiconductor material, a conductive metal nitride, a metal, and/or a metal-semiconductor compound. The dielectric layer 185 may conformally cover or overlap the first electrode 181. The dielectric layer 185 may include, for example, at least one of a high-k material such as zirconium oxide ($ZrO_2$), aluminum oxide ($Al_2O_3$), and/or hafnium oxide ($Hf_2O_3$).

Figure 3B:
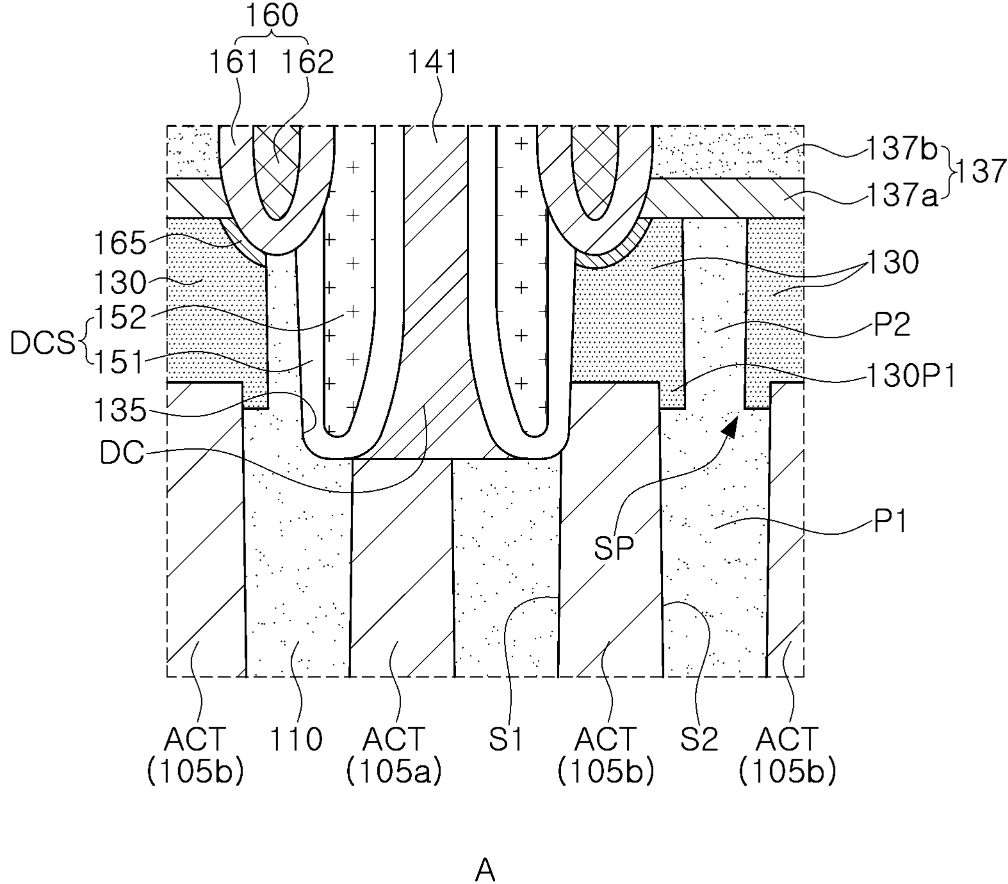

FIG. 3B is a partially enlarged cross-sectional view of a semiconductor device according to example embodiments.

Referring to FIG. 3B, an embodiment in which the bit line contact hole 135 is misaligned with the active region ACT is illustrated. In a case in which the pad layers are separated by a separate isolation layer, process dispersion may occur in which the separate isolation layer and the bit line contact hole 135 are misaligned to approach each other. In this case, the width of the pad layer connected to the contact structure 160 may decrease, such that a contact margin with the contact structure 160 may decrease. According to example embodiments of the present inventive concept, even if misalignment of the bit line contact hole 135 occurs, there is no misalignment problem of a separate separation layer, and thus the width of the pad layer may be secured. Accordingly, a contact margin between the self-aligned pad layer 130 and the contact structure 160 may be secured. On the other hand, since the semiconductor device 100 includes the self-aligned pad layers 130 that are self-aligned on the active regions ACT without a separate isolation layer, a neck defect between the active regions ACT, which may be caused by misalignment of the separate isolation layers, may also be prevented.

Figure 4A:
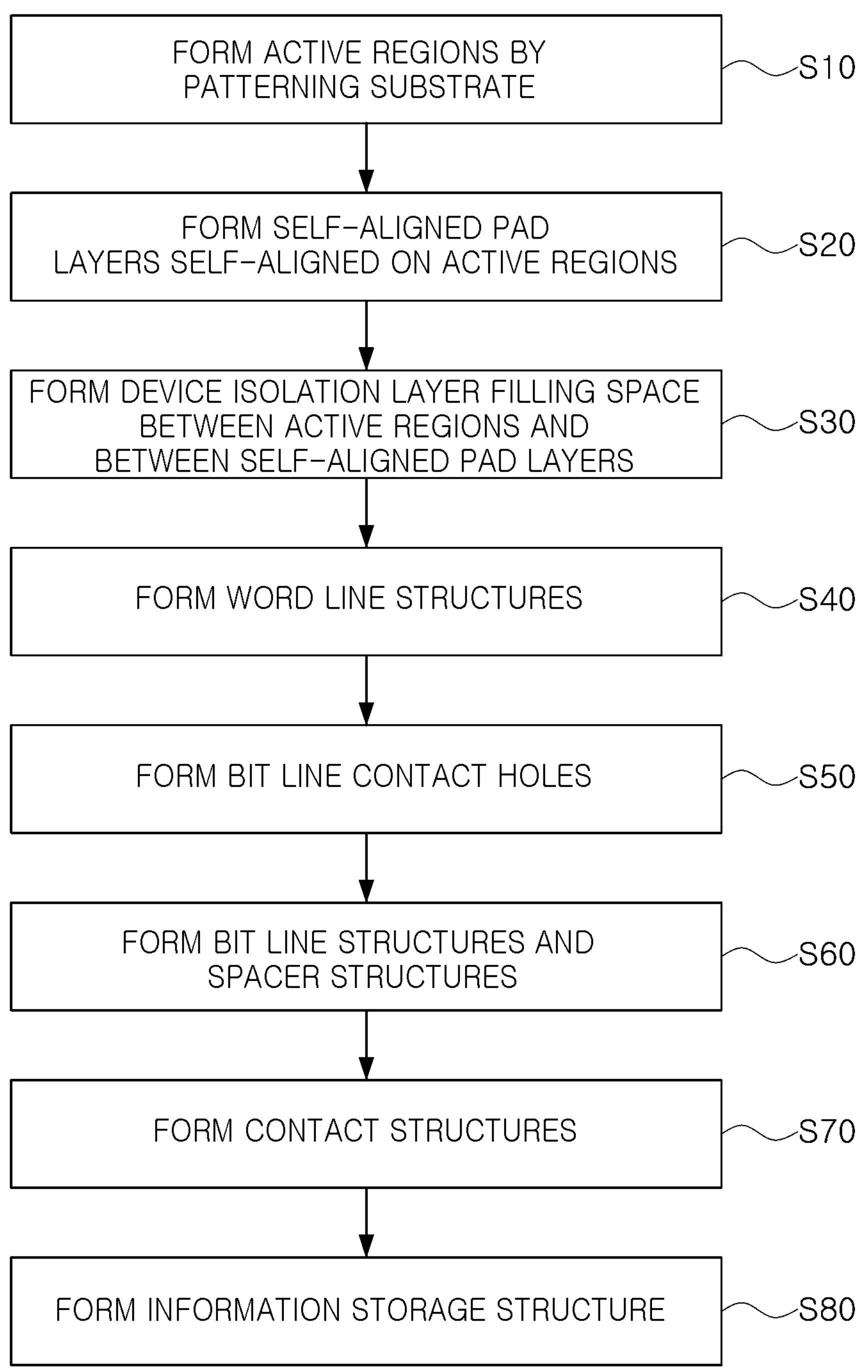
FIGS. 4A and 4B are flowcharts sequentially illustrating a method of manufacturing a semiconductor device according to example embodiments.
Figure 4B:
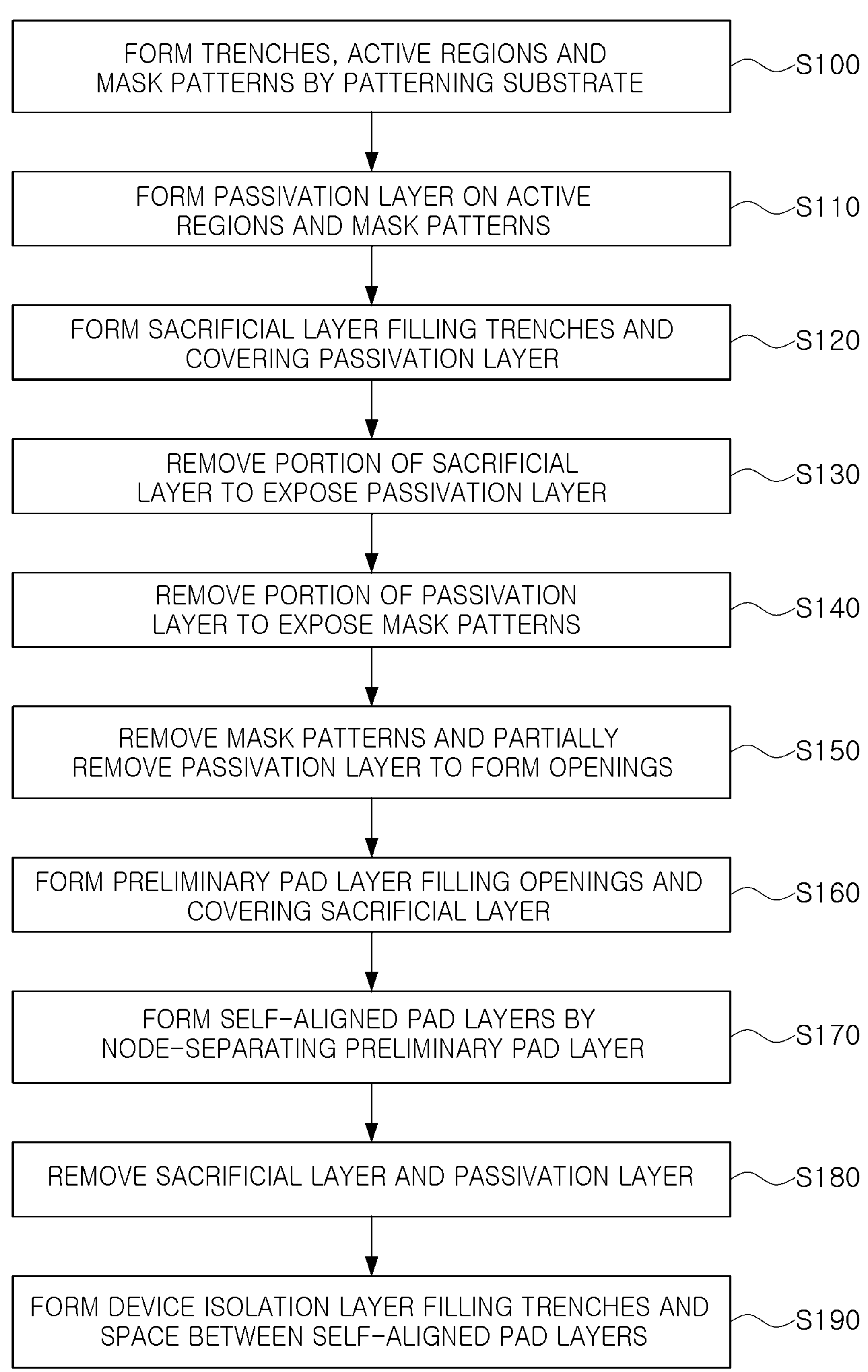

FIGS. 4A and 4B are flowcharts sequentially illustrating a method of manufacturing a semiconductor device according to example embodiments.

Referring to FIG. 4A, the substrate 101 may be patterned to form active regions ACT (S10), self-aligned pad layers 130 may be formed on the active regions ACT (S20), the device isolation layer 110 filling space between the active regions ACT and between the self-aligned pad layers 130 may be formed (S30), word line structures WLS may be formed (S40), bit line contact holes 135 may be formed (S50), bit line structures BLS and spacer structures SS may be formed (S60), contact structures 160 may be formed (S70), and an information storage structure DS may be formed (S80).

FIG. 4B describes operation S20 of forming the self-aligned pad layers 130 of FIG. 4A in more detail. Detailed manufacturing operations of the semiconductor device illustrated in FIG. 4B will be described with reference to FIGS. 5A to 15B below.

FIGS. 5A to 15B are drawings illustrating a method of manufacturing a semiconductor device according to example embodiments.

Figure 5A:
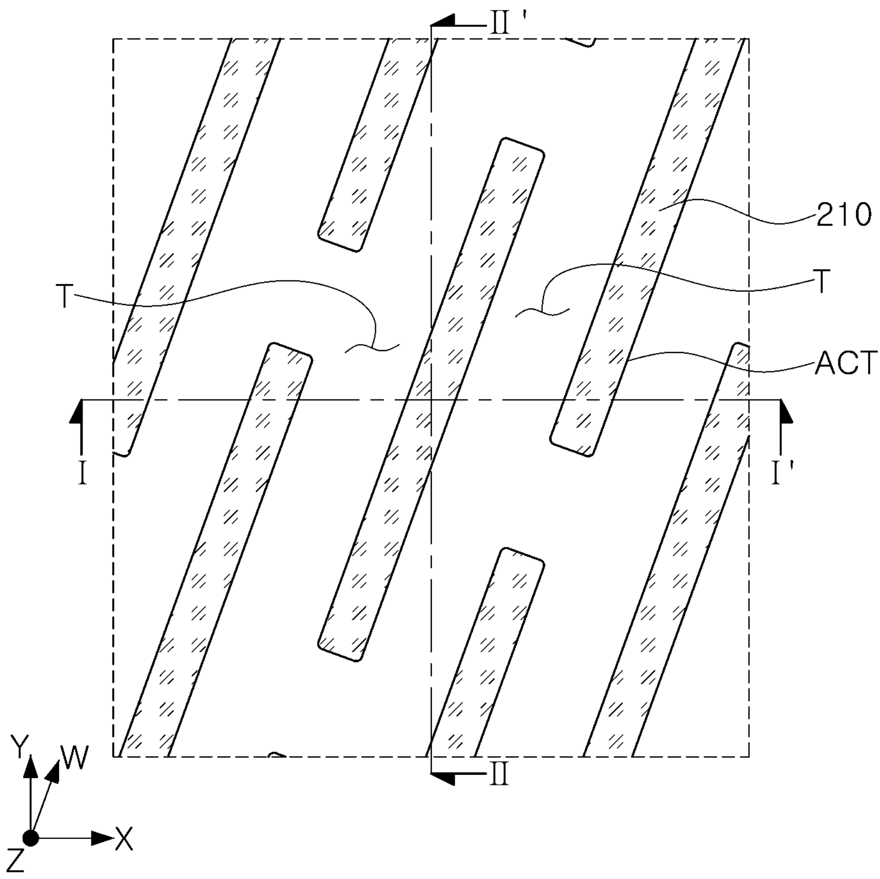
FIGS. 5A, 5B, 6A, 6B, 7, 8A, 8B, 9A, 9B, 10, 11A, 11B, 12A, 12B, 13, 14A, 14B, 15A, and 15B are drawings illustrating a method of manufacturing a semiconductor device according to example embodiments.
Figure 5B:
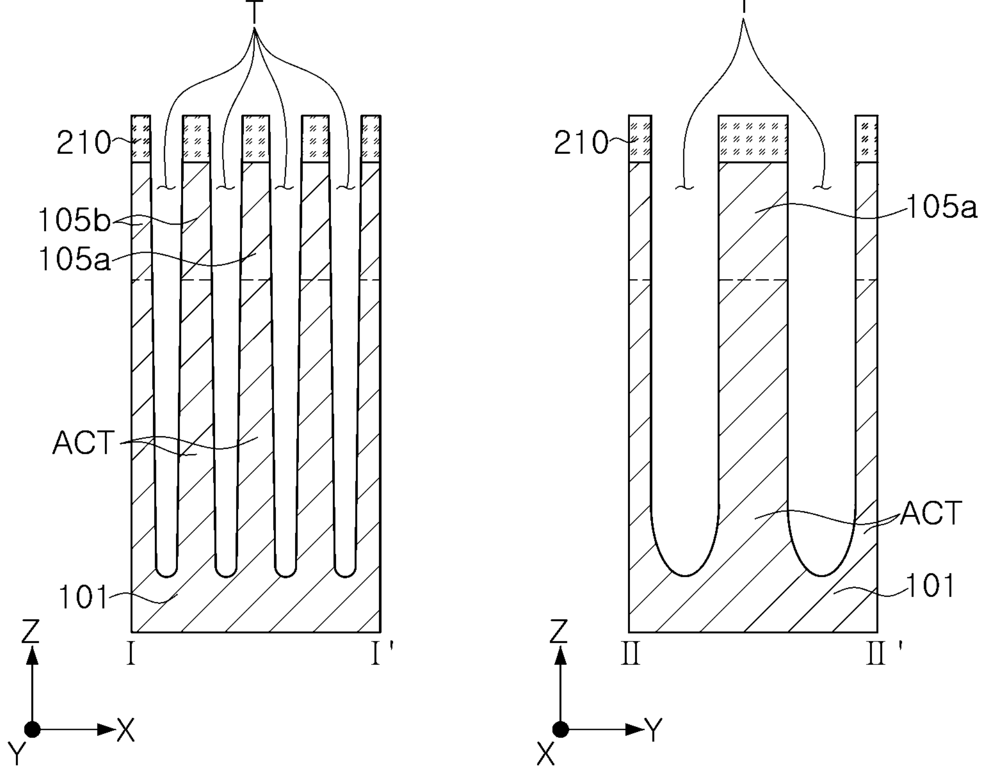

Referring to FIGS. 4B, 5A, and 5B, the substrate 101 may be patterned to form trenches T, active regions ACT, and mask patterns 210 (S100). The active regions ACT may be formed by forming a mask layer on the substrate 101 and performing a photolithography process and an etching process to remove a portion of the substrate 101. Trenches T may be formed in a region from which a portion of the substrate 101 has been removed. The trenches T may surround side surfaces of the active regions ACT. An ion implantation process may be performed on the active regions ACT to form impurity regions. After the substrate 101 is patterned, the mask layer may be formed as mask patterns 210 on the respective active regions ACT. Each of the mask patterns 210 may have a shape that becomes narrower from the bottom to the top.

Figure 6A:
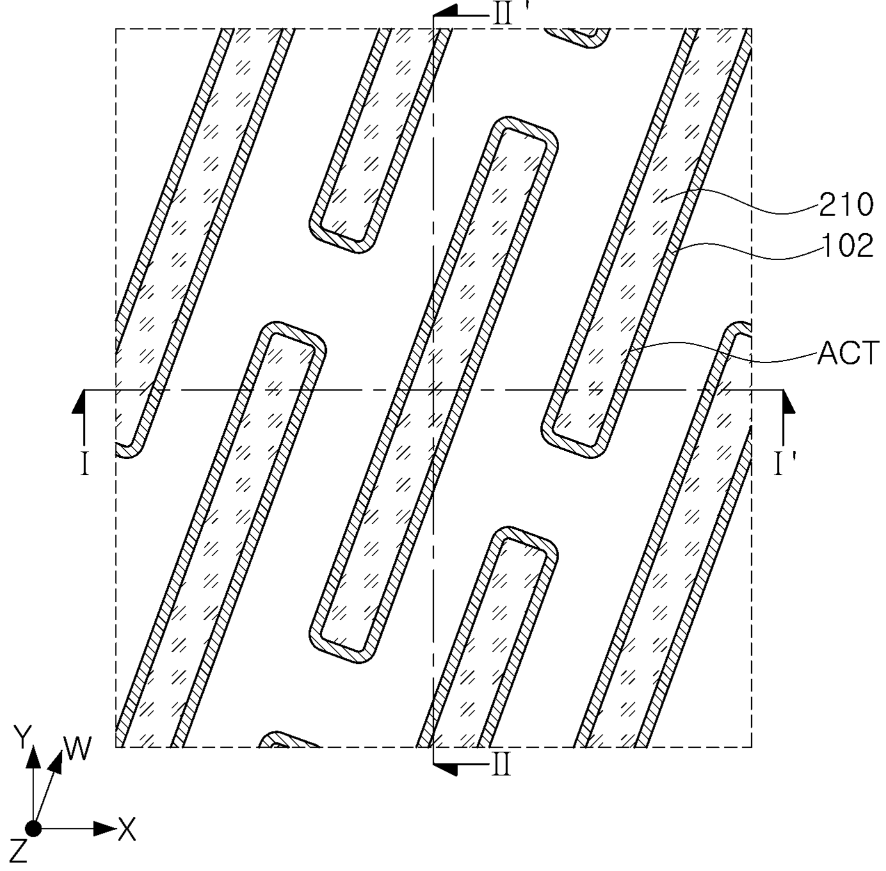
Figure 6B:
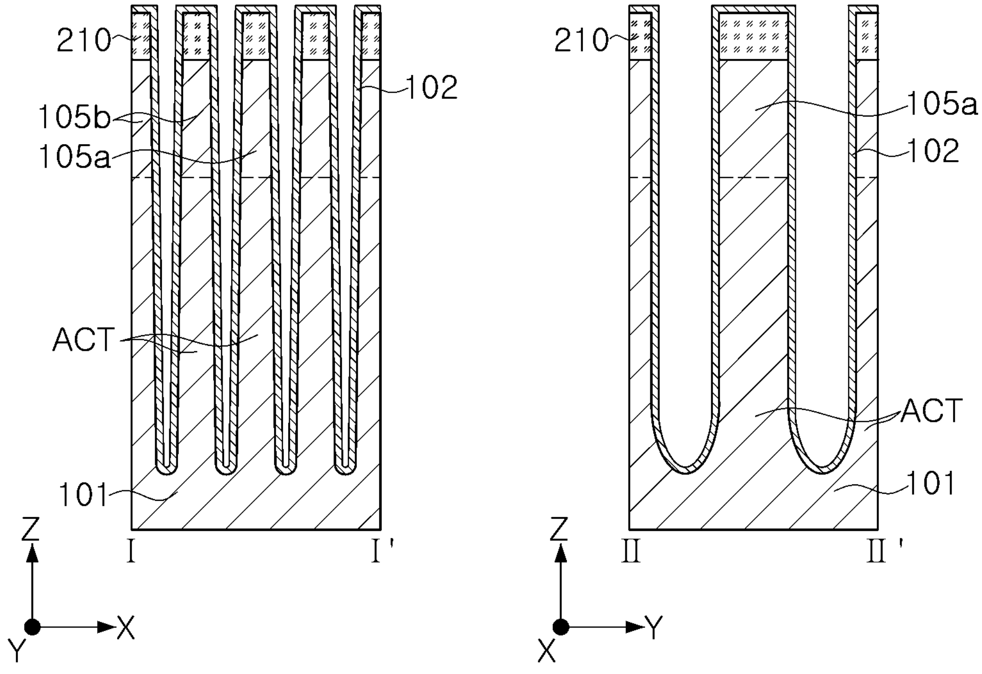

Referring to FIGS. 4B, 6A, and 6B, a passivation layer 102 may be formed on the active regions ACT and the mask patterns 210 (S110). The passivation layer 102 may cover or overlap side surfaces of the active regions ACT and may cover or overlap upper surfaces and side surfaces of the patterned mask patterns 210. The passivation layer 102 may be formed of, for example, but not limited to, silicon oxide. The passivation layer 102 may serve to protect the active regions ACT in a subsequent process.

Figure 7:
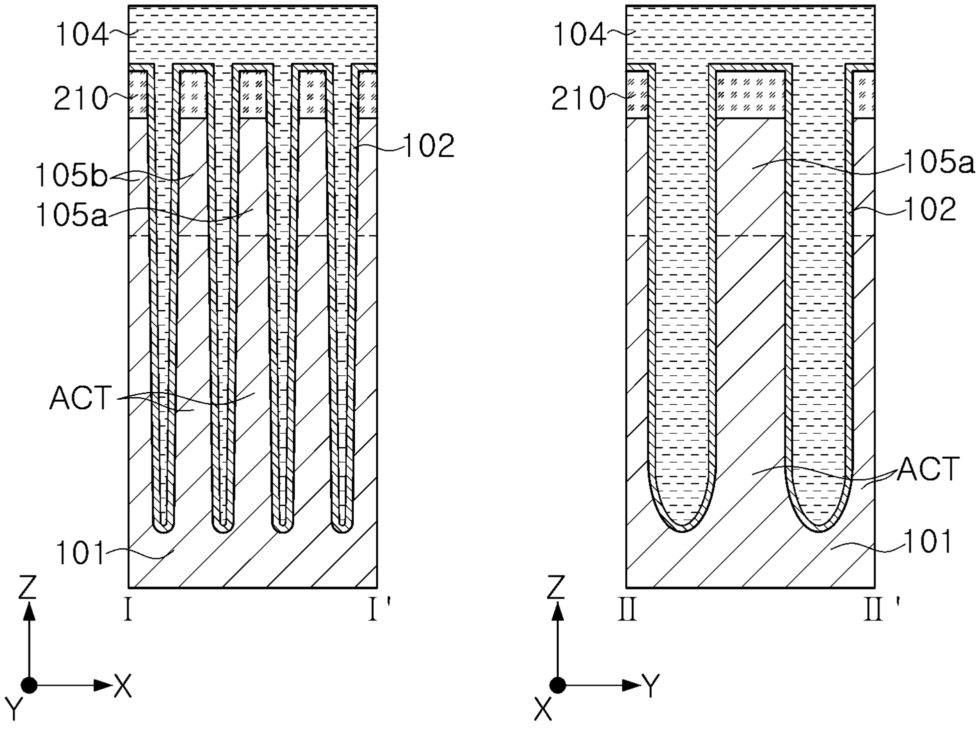

Referring to FIGS. 4B and 7, a sacrificial layer 104 filling the trenches T and covering or overlapping the passivation layer 102 may be formed (S120). The sacrificial layer 104 may also be formed on the upper surface of the passivation layer 102 covering or overlapping the upper surface of the mask patterns 210. The sacrificial layer 104 has a film quality that may be removed by a wet etching process, and may include, for example, a material such as a metal, a metal nitride, or a silicon nitride. For example, the sacrificial layer 104 may be formed of titanium nitride (TiN).

Figure 8A:
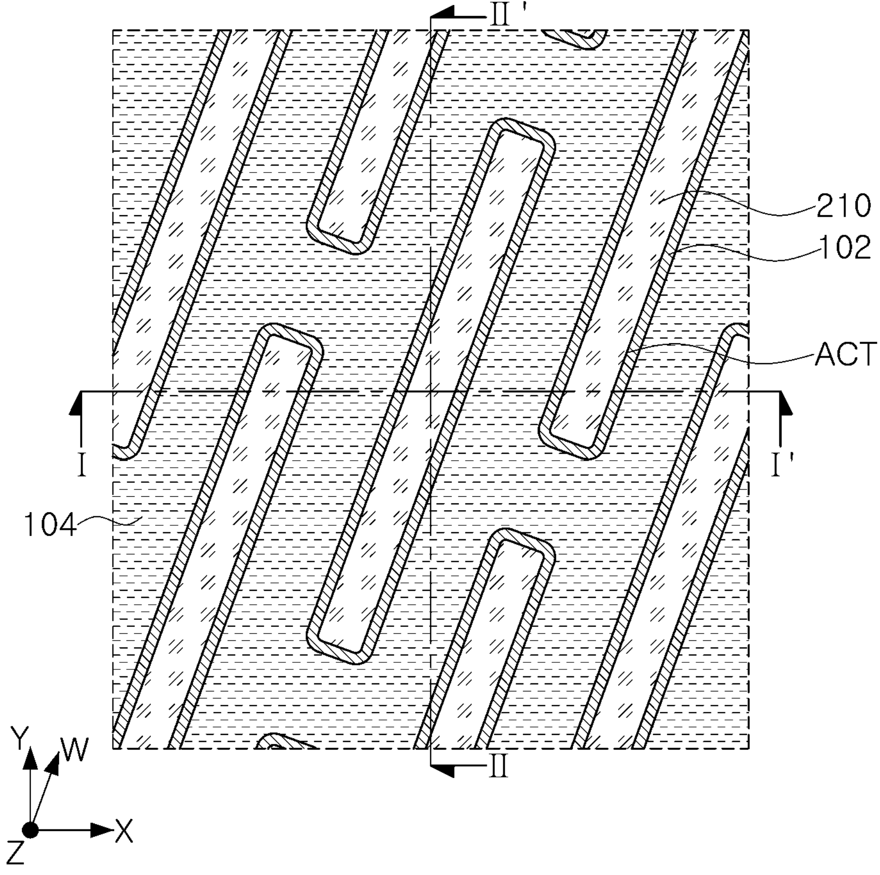
Figure 8B:
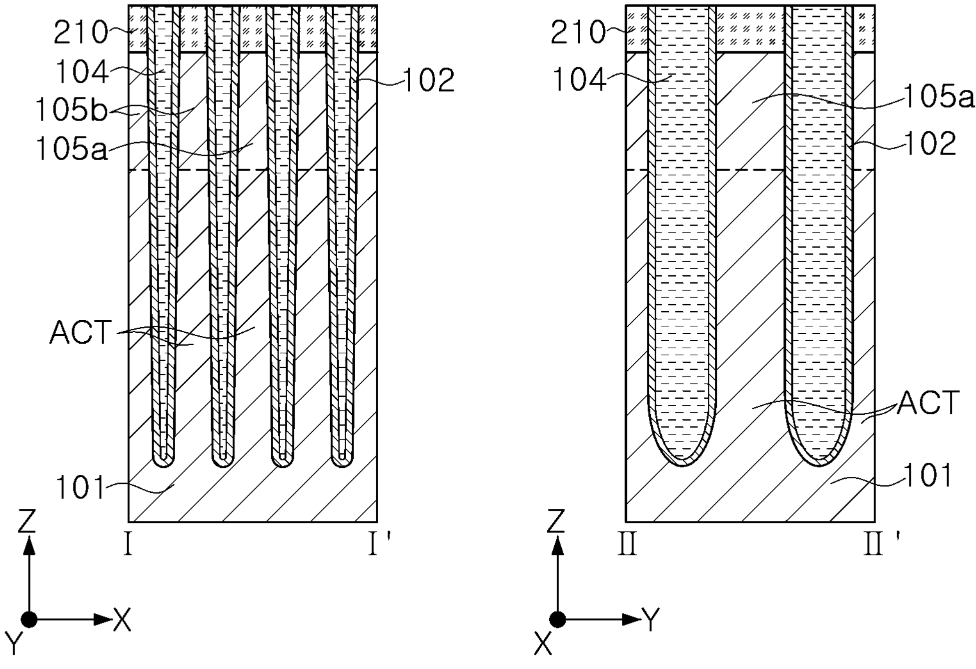

Referring to FIGS. 4B, 8A, and 8B, a portion of the sacrificial layer 104 covering or overlapping the upper surface of the passivation layer 102 may be removed by performing an etch-back process to expose the passivation layer 102 (S130), and a portion of the passivation layer 102 covering or overlapping the upper surfaces of the mask patterns 210 may be removed by performing a strip process to expose the mask patterns 210 (S140).

Figure 9A:
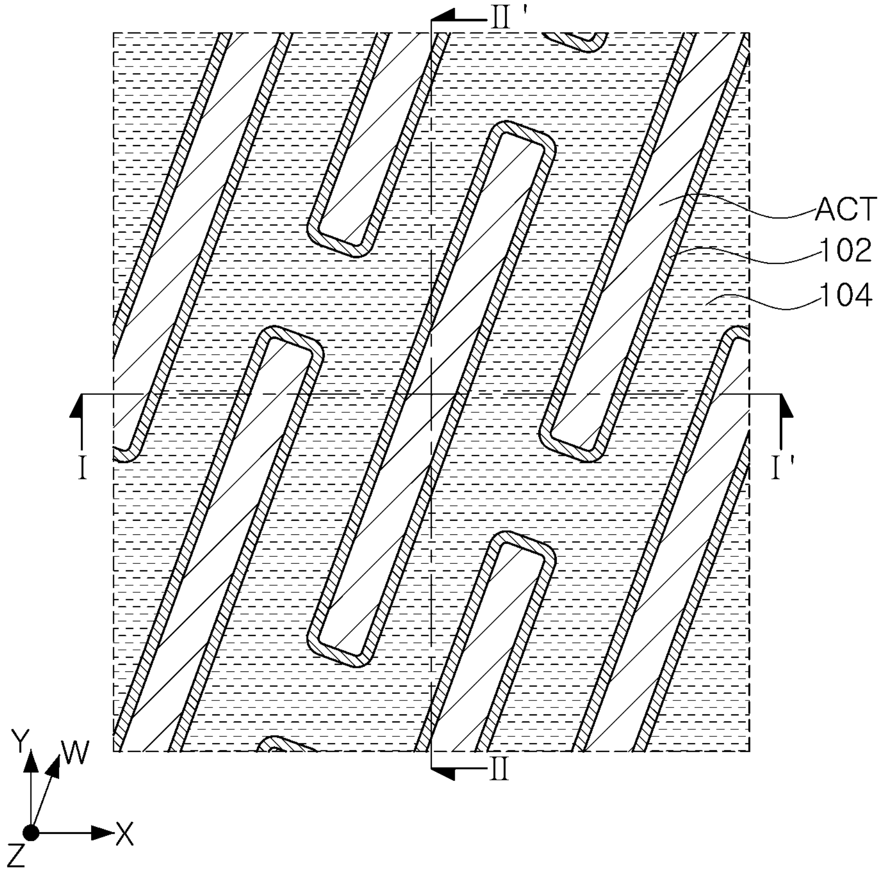
Figure 9B:
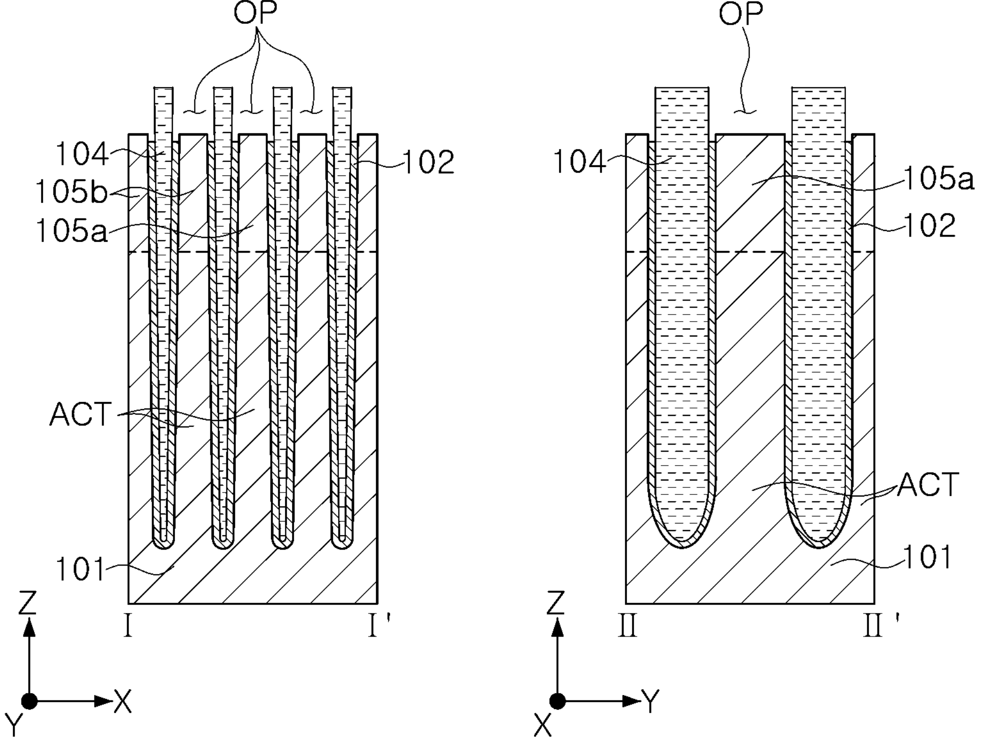

Referring to FIGS. 4B, 9A, and 9B, the mask patterns 210 may be removed and the passivation layer 102 may be partially removed to form openings OP (S150). The mask patterns 210 may be completely removed, and the passivation layer 102 covering or overlapping side surfaces of the mask patterns 210 may be partially removed. The passivation layer 102 may be removed from the upper portion to have an upper surface recessed to a level lower than a level of the upper surface of the active regions ACT. Upper regions of side surfaces of the active regions ACT may be exposed. Accordingly, the openings OP may be formed in the active regions ACT. The openings OP may have an island shape extending in the W direction on the active regions ACT. Removing the mask patterns 210 may include performing a wet etching process and a cleaning process.

Figure 10:
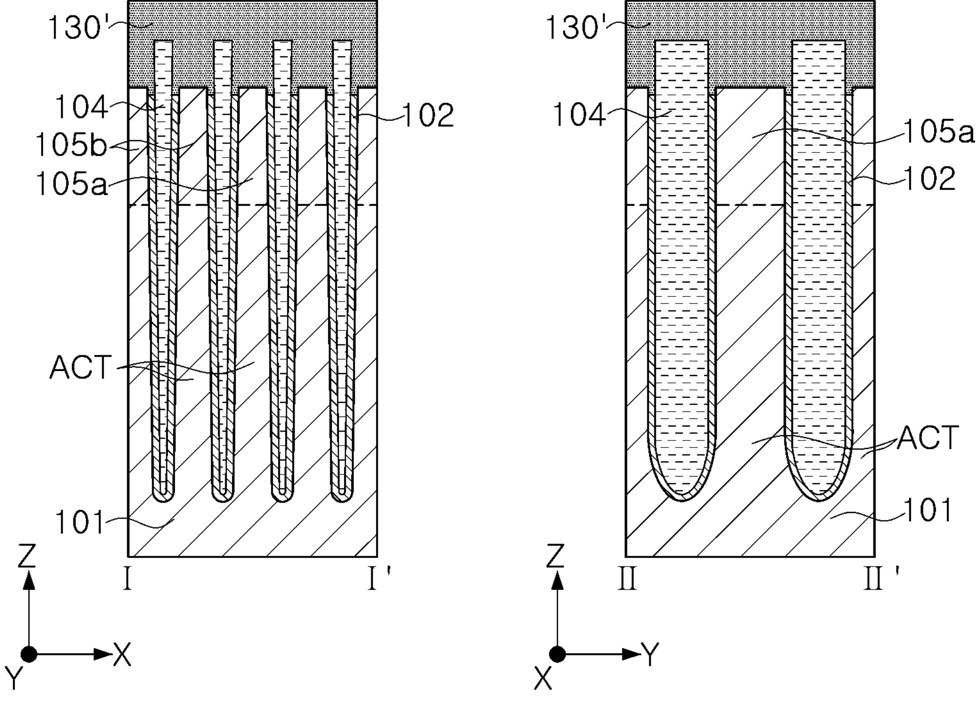

Referring to FIGS. 4B and 10, a preliminary pad layer 130' may be formed to fill the openings OP and cover the sacrificial layer 104 (S160). The preliminary pad layer 130' may be formed of, for example, polysilicon. After the polysilicon layer included in the preliminary pad layer 130' is formed, a laser annealing process may be performed to remove voids therein.

Figure 11A:
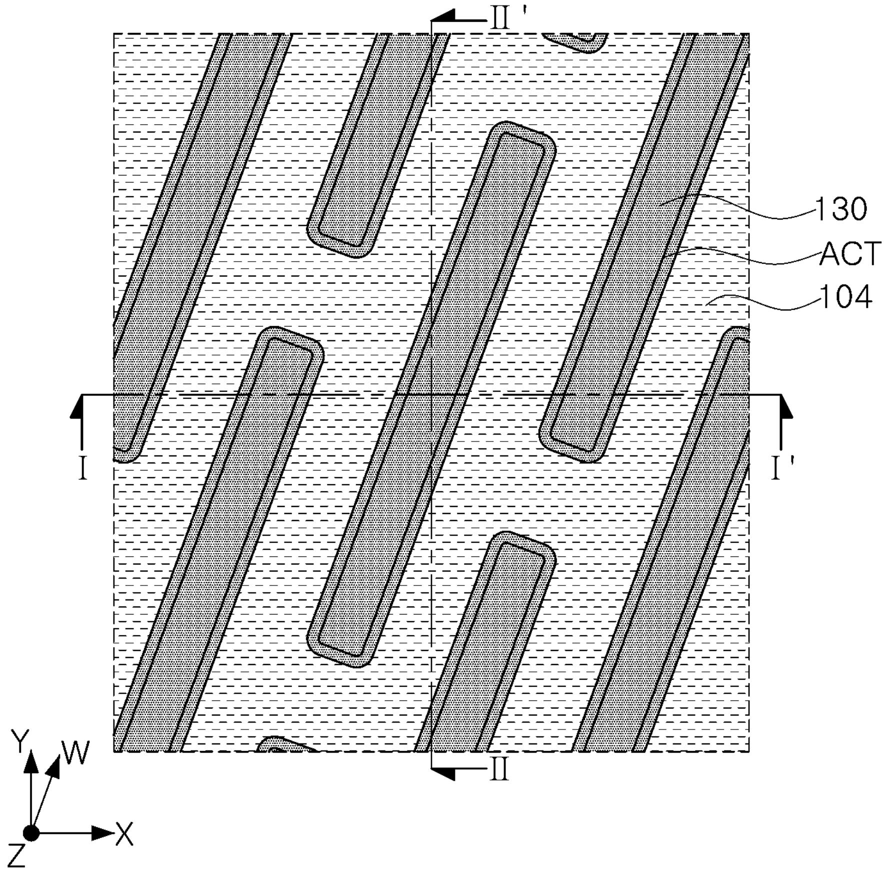
Figure 11B:
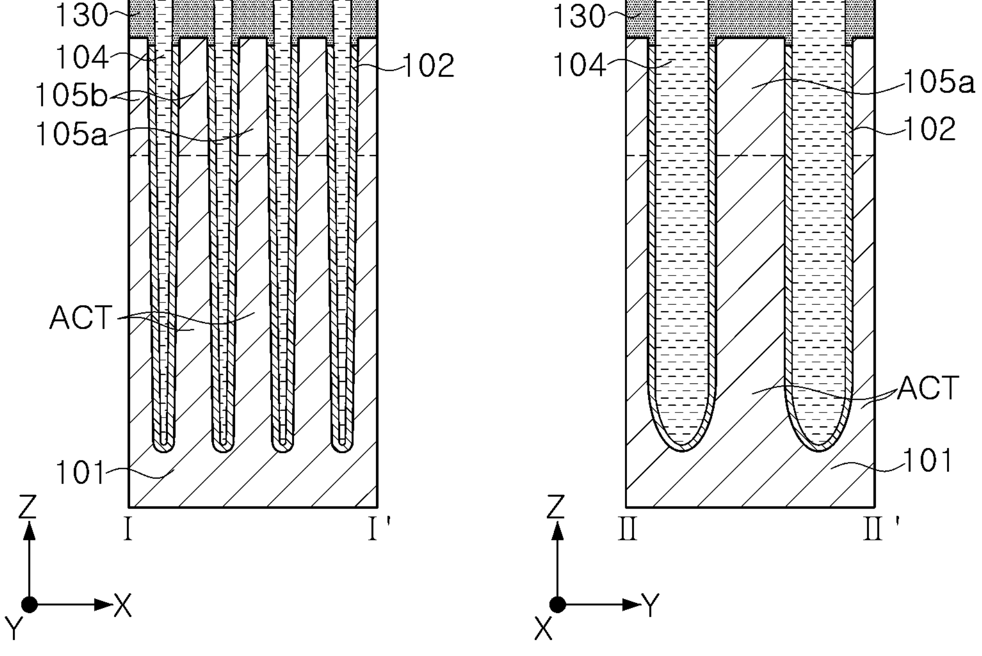

Referring to FIGS. 4B, 11A, and 11B, the self-aligned pad layers 130 may be formed by node-separating the preliminary pad layer 130' by performing an etch-back process (S170). Node-separating the preliminary pad layer 130' of FIG. 10 may provide node isolation. The self-aligned pad layers 130 may have a shape corresponding to the active regions ACT. For example, the respective self-aligned pad layers 130 may be self-aligned on the respective active regions ACT, to be formed in a line shape extending in the W direction in a plane. In the direction of the minor axis of the active region ACT, the width of the upper surface of the self-aligned pad layer 130 may be greater than the width of the upper surface of the active region ACT. The length of the upper surface of the self-aligned pad layer 130 in the W direction may be greater than the length of the upper surface of the active region ACT in the W direction.

Figure 12A:
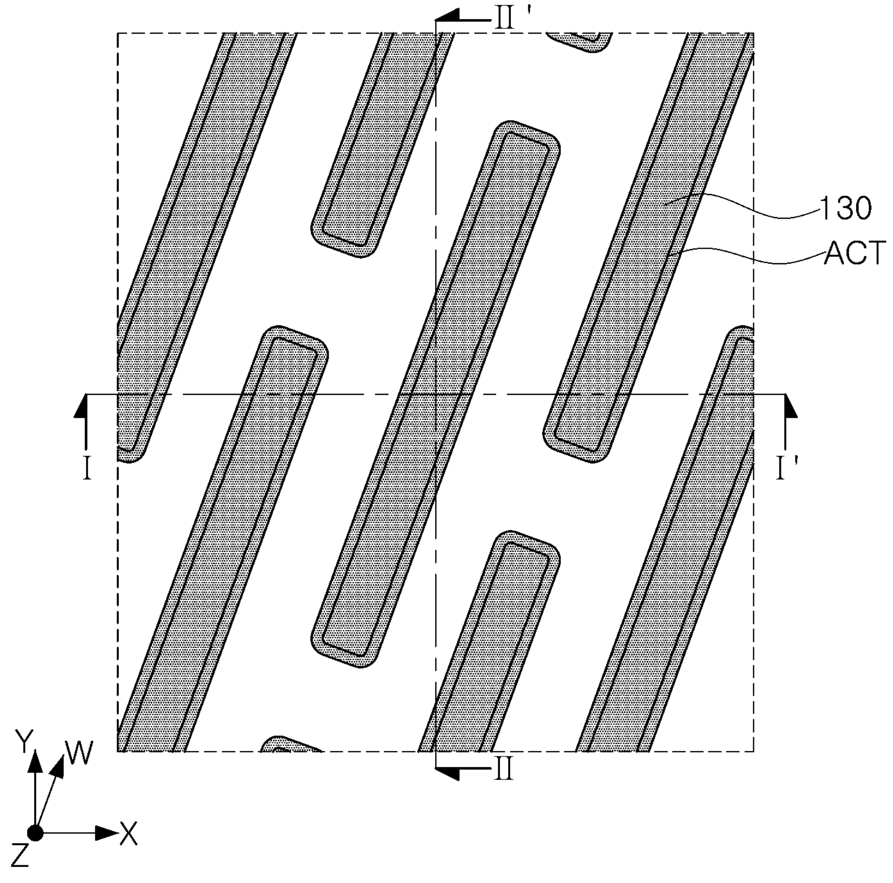
Figure 12B:
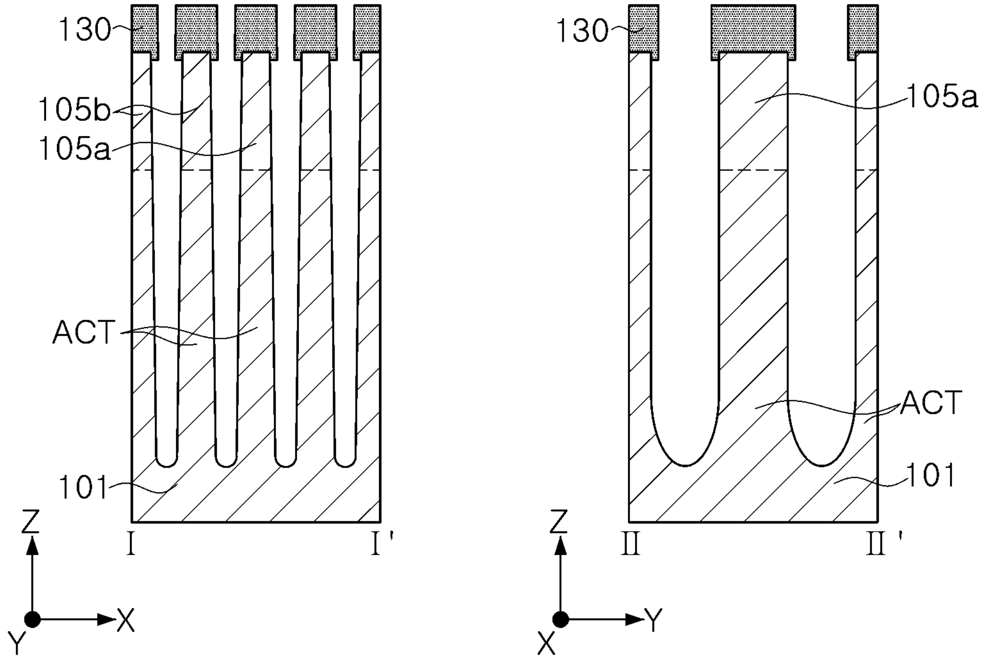

Referring to FIGS. 4B, 12A, and 12B, the sacrificial layer 104 and the passivation layer 102 may be removed (S180). For example, the sacrificial layer 104 and the passivation layer 102 may be removed by performing a wet etching process and a cleaning process.

Figure 13:
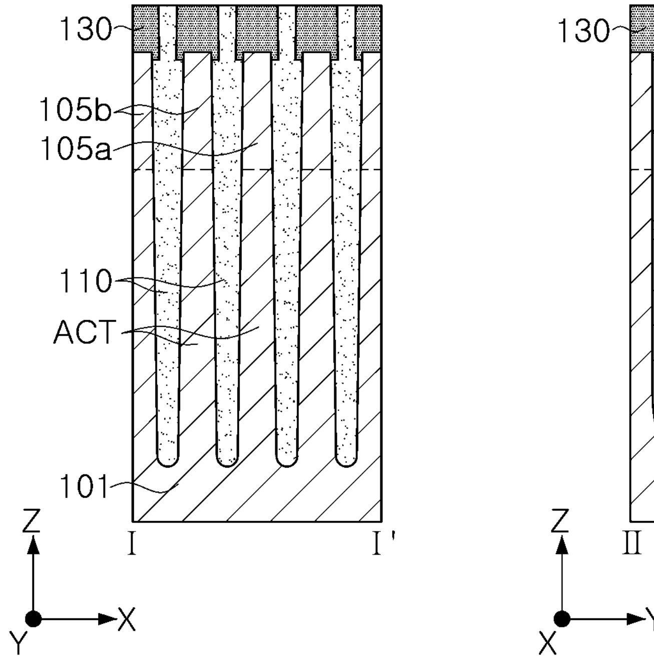

Referring to FIGS. 4B and 13, the device isolation layer 110 that at least partially fills the trenches T and space between the self-aligned pad layers 130 may be formed (S190). The device isolation layer 110 may cover or overlap side surfaces of the self-aligned pad layers 130 and side surfaces of the active regions ACT.

Figure 14A:
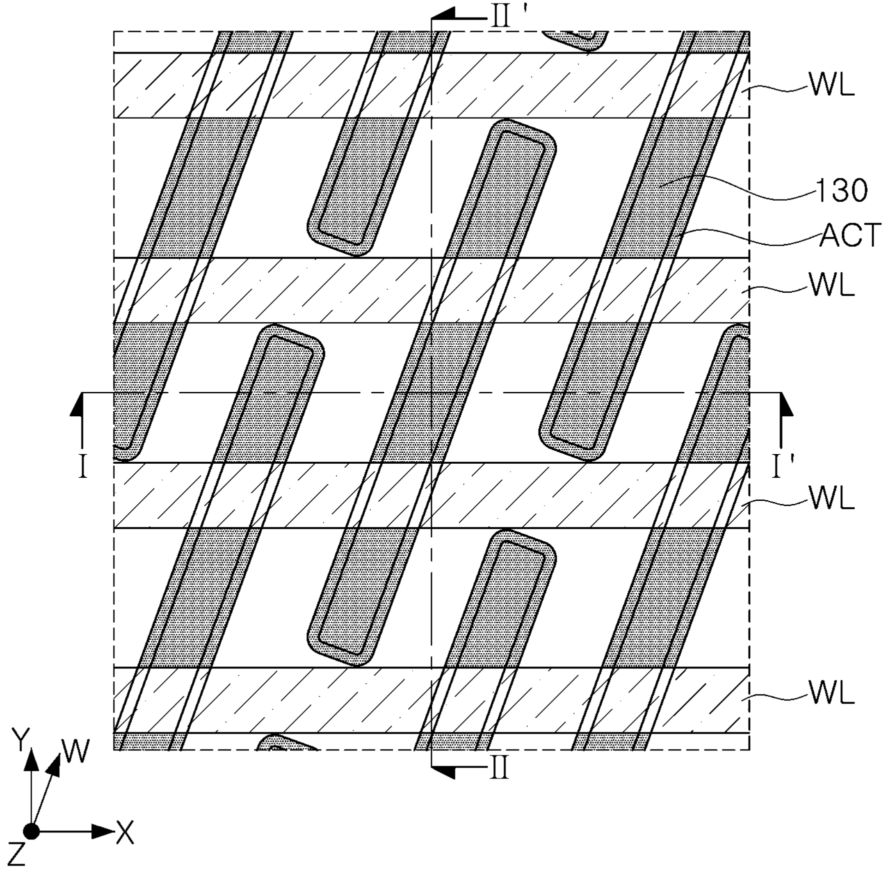
Figure 14B:
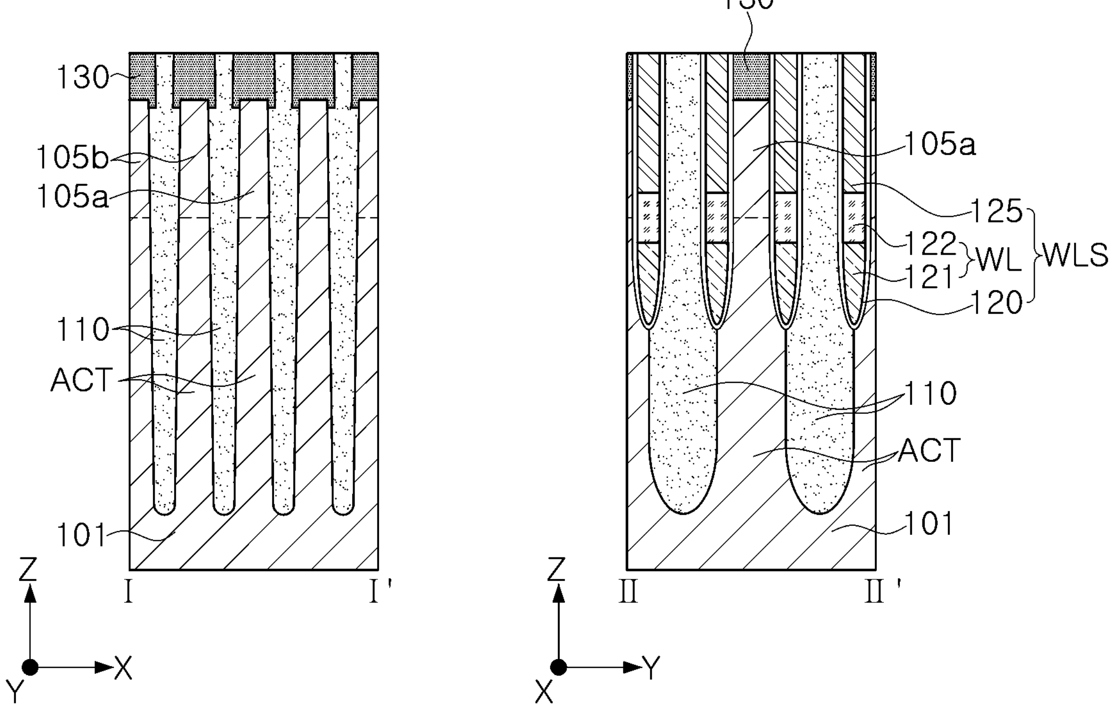

Referring to FIGS. 14A and 14B, the word line structure WLS may be buried in the substrate 101 to traverse the active region ACT. Forming the word line structure WLS may include forming a gate trench 115 extending in the substrate 101, and forming a gate dielectric layer 120, a word line WL, and a gate capping layer 125 in the gate trench 115. The word line structure WLS may penetrate through the self-aligned pad layers 130, and the self-aligned pad layer 130 may contact a side surface of the word line structure WLS. The self-aligned pad layers 130 may be partially separated by the word line structure WLS.

Figure 15A:
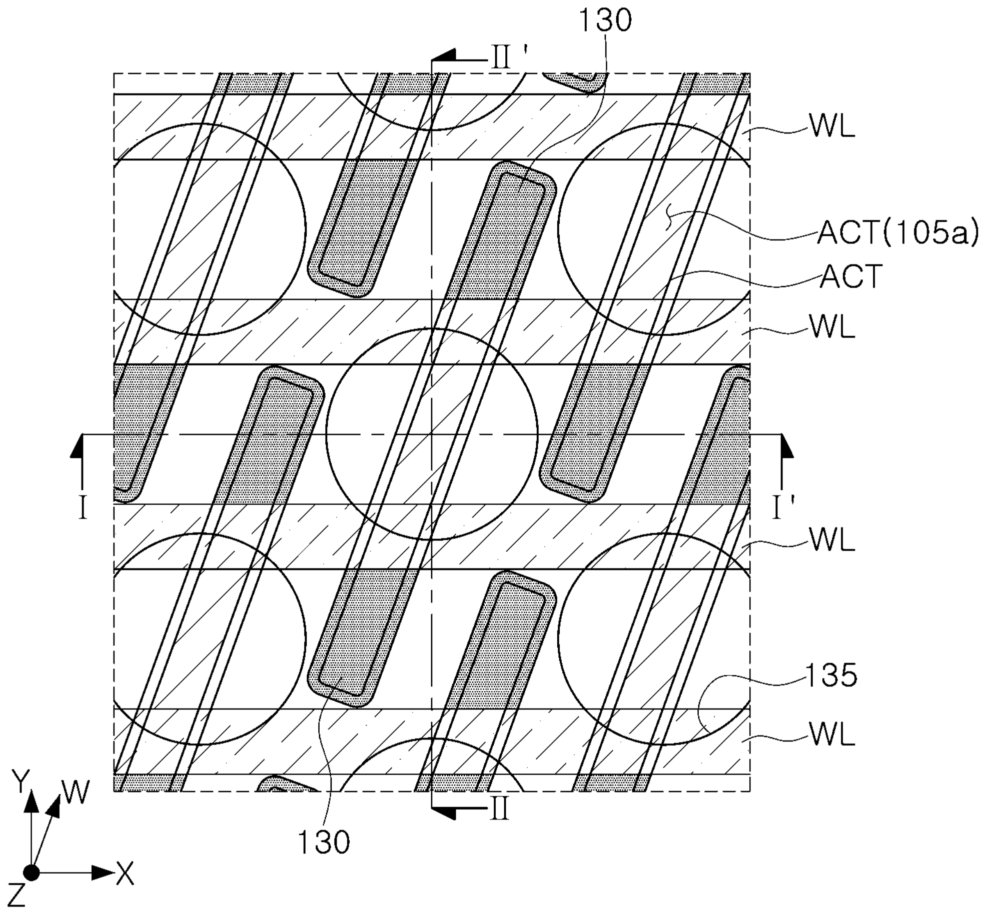
Figure 15B:
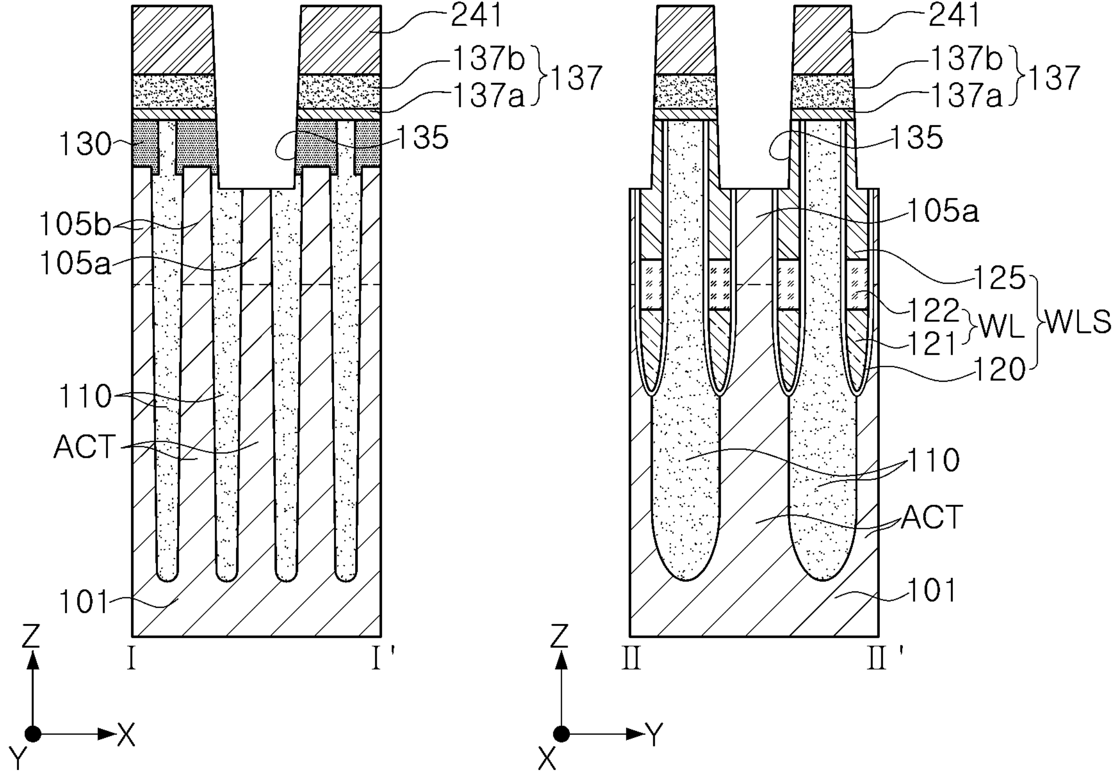

Referring to FIGS. 15A and 15B, a buffer insulating layer 137 and a mask layer 241 may be formed, and a bit line contact hole 135 may be formed. The bit line contact hole 135 may expose the first impurity region 105*a* of the active region ACT.

Next, the bit line BL including the bit line contact pattern DC, the bit line capping pattern BC on the bit line BL, and the bit line contact spacer DCS may be formed. Accordingly, the bit line structure BLS may be formed. Insulating spacer layers may be formed on the side of the bit line structure BLS, a spacer structure (SS) may be formed by partially etching the insulating spacer layers, and contact holes partially exposing the self-aligned pad layers 130 may be formed. Before forming the contact holes, sacrificial patterns are formed between the bit line structures BLS, and after etching a portion of the sacrificial patterns on a position vertically overlapping with the word line structure WLS, the same is filled with a material different from the sacrificial patterns, thereby forming insulating fences (not illustrated). A barrier layer 161 and a contact conductive layer 162 may be formed in the contact holes to form a contact structure 160. The isolation insulating patterns 170 passing through the contact structure 160 may be formed, and an etch stop layer 175 and an information storage structure DS may be formed on the contact structure 160. Accordingly, the semiconductor device 100 of FIGS. 1 to 3A may be manufactured.

As set forth above, by disposing a self-aligned pad layer on the active region, a semiconductor device having improved electrical characteristics and reliability may be provided.

While example embodiments have been illustrated and described above, it will be apparent to those skilled in the art that modifications and variations could be made without departing from the scope of the present inventive concept as defined by the appended claims.

What is claimed is:

1. A semiconductor device comprising:

an active region between portions of a device isolation layer on a substrate;

a self-aligned pad layer on a first region of the active region;

a bit line that is electrically connected to a second region of the active region; and a contact structure on a side surface of the bit line and electrically connected to the self-aligned pad layer, wherein the self-aligned pad layer comprises a pad protrusion that extends along an upper portion of a side surface of the first region of the active region, and wherein a side of the self-aligned pad layer is in contact with the device isolation layer, and wherein an upper surface of the device isolation layer is coplanar with an upper surface of the self-aligned pad layer.

2. The semiconductor device of claim 1, wherein a width of an upper portion of the self-aligned pad layer is less than a width of a lower portion of the self-aligned pad layer.

3. The semiconductor device of claim 1, wherein a lower surface of the pad protrusion of the self-aligned pad layer is lower than the upper surface of the device isolation layer with respect to the substrate.

4. The semiconductor device of claim 1, wherein the self-aligned pad layer comprises polysilicon.

5. The semiconductor device of claim 1, wherein in plan view, the pad protrusion overlaps an upper surface of the first region of the active region with a substantially uniform thickness.

6. The semiconductor device of claim 1, wherein in plan view, the active region has a rectangular shape having a major axis and a minor axis, wherein in plan view, the active region has a first surface and a second surface parallel to the major axis, and wherein the self-aligned pad layer has a third surface parallel to the first surface of the active region and a fourth surface parallel to the second surface of the active region.

7. The semiconductor device of claim 1, wherein the active region has a rectangular shape having a major axis and a minor axis, and wherein a width of the self-aligned pad layer is greater than a width of the active region in a direction of the minor axis.

8. The semiconductor device of claim 1, wherein in plan view, the self-aligned pad layer comprises a first pattern portion on a first end of the active region and a second pattern portion on a second end opposite to the first end of the active region.

9. The semiconductor device of claim 1, further comprising:

a word line structure on a side surface of the active region and extending into the device isolation layer, wherein the word line structure comprises a gate dielectric layer, a word line on the gate dielectric layer, and a gate capping layer on the word line, and wherein a side surface of the word line structure is in contact with the self-aligned pad layer.

10. The semiconductor device of claim 9, wherein an upper surface of the gate capping layer is on substantially at a same level as the upper surface of the self-aligned pad layer with respect to the substrate.

11. The semiconductor device of claim 9, further comprising:

a buffer insulating layer on the device isolation layer and the self-aligned pad layer;

a bit line contact pattern electrically connected to the bit line and in a bit line contact hole that penetrates the buffer insulating layer;

a spacer structure between the bit line and the contact structure;

an isolation insulating pattern that penetrates the contact structure; and an information storage structure on the contact structure and electrically connected to the contact structure.

12. A semiconductor device comprising:

a word line extending in a first direction;

a first active region and a second active region adjacent to each other in the first direction;

a device isolation layer between the first active region and the second active region;

a first pad layer on the first active region;

a second pad layer on the second active region; and a bit line on the first active region and the second active region and extending in a second direction that intersects the first direction, wherein the word line intersects at least one of the first active region and the second active region, wherein in the first direction, a first distance between a side surface of the first pad layer and a side surface of the second pad layer is less than a second distance between an upper side surface of the first active region and an upper side surface of the second active region that are closest to one another, and wherein an upper surface of the device isolation layer is coplanar with an upper surface of the first pad layer and an upper surface of the second pad layer.

13. The semiconductor device of claim 12, wherein the device isolation layer is in contact with the side surface of the first pad layer and the side surface of the second pad layer.

14. The semiconductor device of claim 12, wherein the upper surface of the device isolation layer is higher than a lower surface of the first pad layer and a lower surface of the second pad layer with respect to a substrate.

15. The semiconductor device of claim 12, further comprising:

a gate capping layer on the word line, wherein an upper surface of the gate capping layer is higher than a lower surface of the first pad layer and a lower surface of the second pad layer with respect to a substrate.

16. The semiconductor device of claim 12, wherein in plan view, the first pad layer comprises a first pad protrusion on an upper side surface of the first active region with a substantially uniform thickness, wherein in plan view, the second pad layer comprises a second pad protrusion on an upper side surface of the second active region with a substantially uniform thickness, and wherein the first pad protrusion is lower than an upper surface of the first active region, and the second pad protrusion is lower than an upper surface of the second active region with respect to a substrate.

17. A semiconductor device comprising:

active regions between portions of a device isolation layer on a substrate;

self-aligned pad layers on the active regions; and bit lines that are electrically connected to the active regions, respectively, wherein the device isolation layer comprises a first portion between adjacent ones of the active regions and a second portion between adjacent ones of the self-aligned pad layers, and wherein the device isolation layer includes a bent portion in a region in which the first portion and the second portion are connected to each other, and wherein an upper surface of the device isolation layer is coplanar with an upper surface of the self-aligned pad layer.

18. The semiconductor device of claim 17, wherein the second portion of the device isolation layer is in contact with side surfaces of the self-aligned pad layers.

19. The semiconductor device of claim 17, wherein the second portion of the device isolation layer is higher than an upper surface of a respective one of the active regions with respect to the substrate.

20. The semiconductor device of claim 17, wherein a width of a lower portion of the first portion is less than a width of an upper portion of the second portion.

* * * * *